(12) United States Patent
Kettunen et al.

(10) Patent No.: US 8,487,519 B2
(45) Date of Patent: Jul. 16, 2013

(54) LIGHT EMITTING DEVICE

(75) Inventors: Ville Kettunen, Zürich (CH); Hartmut Rudmann, Winterthur (CH); Markus Rossi, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 1051 days.

(21) Appl. No.: 10/533,966

(22) PCT Filed: Nov. 4, 2003

(86) PCT No.: PCT/CH03/00721
§ 371 (c)(1),
(2), (4) Date: Jun. 13, 2006

(87) PCT Pub. No.: WO2004/044995
PCT Pub. Date: May 27, 2004

(65) Prior Publication Data
US 2006/0279955 A1    Dec. 14, 2006

(30) Foreign Application Priority Data
Nov. 13, 2002   (EP) .................................... 02405977

(51) Int. Cl.
*H01J 5/16* (2006.01)
*H01J 61/40* (2006.01)
*H01K 1/26* (2006.01)
*H01K 1/30* (2006.01)

(52) U.S. Cl.
USPC .......................................... 313/110; 313/116

(58) Field of Classification Search
USPC ..................... 313/110–117; 445/23; 362/317, 362/362
See application file for complete search history.

(56) References Cited

U.S. PATENT DOCUMENTS

| 1,966,059 A * | 7/1934 | Chiera .......................... 359/891 |
| 5,130,531 A | 7/1992 | Ito et al. |

(Continued)

FOREIGN PATENT DOCUMENTS

| EP | 1 235 281 A1 | 8/2002 |
| FR | 2 785 364 A1 | 5/2000 |
| JP | 08-330635 | 12/1996 |
| JP | 2002-076440 | 3/2002 |
| JP | 2003-507864 | 2/2003 |
| WO | 01/14790 | 3/2001 |

OTHER PUBLICATIONS

Patent Abstracts of Japan, Optical Semiconductor Element, Publication Date: Apr. 23, 1993.

(Continued)

*Primary Examiner* — Anh Mai
*Assistant Examiner* — Zachary J Snyder
(74) *Attorney, Agent, or Firm* — Rankin, Hill & Clark LLP (57) ABSTRACT

A light emitting device includes an electroluminescent element (1), a housing (2) and current supply device for the electroluminescent element. A micro-optical element (12) is coupled to the housing (2) and arranged such that it influences light emitted by the electroluminescent element (1). The micro-optical element may be made up of micro-optical structures on a surface of an at least partially transparent layer (11) coupled to the housing (2). The micro-optical structures may, for example, be manufactured by directly imprinting them on the at least partially transparent layer (11) coupled to the housing or by casting an at least partially transparent layer (11) including the electroluminescent element to a body of the light emitting device. The diffractive optical features of the micro-optical element (12) are designed according to the position, size and shape of the one or more electroluminescent elements (1), and output light distribution of the one or more electroluminescent elements (1).

19 Claims, 5 Drawing Sheets

U.S. PATENT DOCUMENTS

| | | | |
|---|---|---|---|
| 5,698,941 A * | 12/1997 | Jaskie et al. | 313/494 |
| 5,771,328 A * | 6/1998 | Wortman et al. | 385/146 |
| 5,814,870 A | 9/1998 | Spacth | |
| 5,919,551 A * | 7/1999 | Cobb et al. | 428/156 |
| 6,102,552 A | 8/2000 | Tullis | |
| 6,520,670 B2 | 2/2003 | Liang et al. | |
| 2001/0053075 A1 * | 12/2001 | Parker et al. | 362/31 |
| 2002/0113246 A1 | 8/2002 | Nagai et al. | |

OTHER PUBLICATIONS

WO 97/04491, Optoelectronic Transducer and Manufacturing Process, Publication Date: Feb. 6, 1997.

WO 99/25031, Light Emitting Element Having an Optical Element Molded in a Surface Thereof, Publication Date: May 20, 1999.

WO 02/07230, Light Emitting Diodes, Publication Date: Jan. 24, 2002.

WO 03/010588, Difractive Shaping of the Intensity Distribution of a Spatially Partially Coherent Light Beam, Publication Date: Feb. 6, 2003.

Gale M: "Replication techniques for diffractive optical elements", Microelectronic Engineering, 1997, vol. 34, pp. 321-339.

Dhoedt B et al: "Monolithic integration of diffractive lenses with LED-arrays", Journal of Lightwave Technology, 1995, vol. 13, pp. 1065-1073.

* cited by examiner

LIGHT EMITTING DEVICE

BACKGROUND OF THE INVENTION

1. Field of the Invention

This invention relates to light emitting devices comprising an electroluminescent element such as an LED or an organic light emitting diode (OLED).

2. Description of the Related Art

Light Emitting Diodes (LEDs) have been known for a long time. They are available in many forms. Usually they comprise an LED chip—being an example of an electroluminescent element—with appropriate current supply means and a housing. They are a mass product and available for a large variety of wavelengths, emitting powers, and other properties. More recently, Organic Light Emitting Diodes (OLEDs) have increasingly gained popularity. They are based on an electroluminescent element comprising a series of organic thin films between two conductors.

A key problem related to using LED sources is the fact an LED can not be easily collimated or shaped. This follows from the fact that a LED is an extended light source, i.e. a source where the light originates from an extended region of space (typically an LED's active area is a few tens of micrometers up to a few hundreds of micrometers or up to a few millimeters, whereas, for example, a vertical cavity surface emitting laser's (VCSEL's) active area is few micrometers). Consequently, LEDs typically have an output light distribution that extends over a broad angular range. If there is the requirement that the light produced by the LED be focussed, collimated or otherwise influenced, an external optical system has to be arranged next to the LED.

Figure 1:
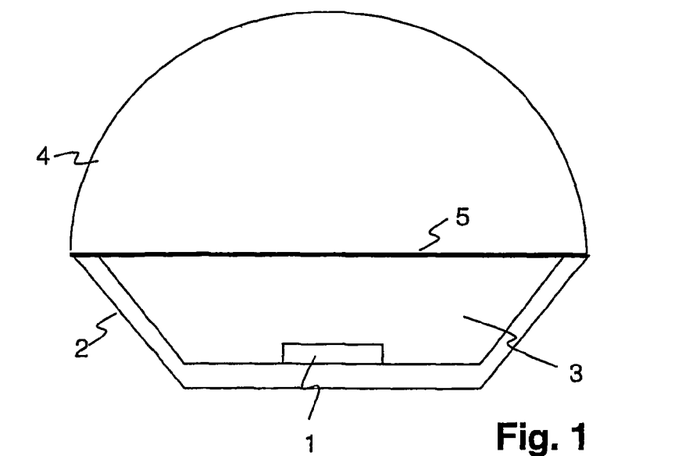
FIG. 1 shows an LED with a collimating optics according to the state of the art.

An example of an LED according to the state of the art comprising such an optical system is shown in FIG. 1. This figure schematically illustrates a set-up comprising an LED consisting of an LED chip 1, a housing 2 which acts as a diffuse reflector redirecting light not emitted into the upward direction, and epoxy 3 (or other transparent material) surrounding the chip. The set-up further comprises an external optics 4 added on top of the epoxy layer by means of an appropriate holder 5. The holder has to be such that there are no poorly defined interfaces between the LED source and the external optics 4. For example, an thin irregular air gap between these components could lead to optical distortions. The holder may for example be an adhesive layer having appropriate optical characteristics. In the conventional case, the optics 4 is usually a so called dome lens, which collects light emitted by the chip and weakly collimates it. A typical output obtained with such setup follows Lambert's cosine law, i.e. intensity distribution is directly related to the cosine of the angle the source is viewed from.

A more narrow angular distribution can only be achieved by means of complicated reflector and/or lens systems. A complicated system of optical components is also necessary in order to additionally shape the emitted light beam.

In the prior art it has been suggested to use diffractive optical elements (DOES) in conjunction with LEDs. WO 97/04491 discloses a DOE as a replacement for a spherical or aspherical lens shaped in a glass carrier on which a LED is mounted. EP 1 115 155 A2 shows a optical computer with an array of LEDs arranged under a glass plate comprising electrodes for contacting the LEDs and an array of DOEs for collimating light emitted by the LEDs.

LEDs are often used as components of LED display panels comprising an array or irregular arrangement of LEDs. The mounting of LEDs comprising a dome lens in such an LED panel requires separate holding means if the dome lens is not to protrude from the top surface of the LED panel, and the mounting of an additional reflector and/or lens system is too complicated for most applications. Further, due to the size of the dome shaped lenses, the LED panels having these state of the art collimation means have a considerable minimum thickness. In other applications, such as interior lighting, light coupling into back-or front light displays, projection displays, LCD projectors or flash lights for miniature cameras, the compactness of the overall light emitting device is of major importance.

SUMMARY OF THE INVENTION

It is an objective of the present invention to provide a light source comprising an LED chip, the light source having improved properties compared to the prior art LEDs. Preferably, the light source's set up should provide an increased flexibility such that it may even be tailored to meet the demands of particular applications.

Especially, it would be desirable to have a solution that allows better collimation/shaping of the light distribution of light emitted by an LED.

The light source preferably should be such that it can be manufactured in large quantities at low cost.

The light source further should be designed such that it can flexibly be integrated into LED devices without the necessity of sophisticated manufacturing techniques.

It is a further objective of the invention to provide an LED panel which is easy to manufacture and which preferably has at least some of the above mentioned favorable properties.

It is yet a further objective of the invention to provide a manufacturing method of light sources, which preferably have at least some of the above mentioned favorable properties.

Finally, it is an objective of the invention to provide manufacturing methods of LED panels.

A first principle of the invention is to collimate and/or otherwise shape the initial, typically Lambertian, light distribution of a light source comprising an electroluminescent element—such as an LED or OLED light source—by means of a micro-optical element based on diffractive and/or refractive optics.

Micro-optics, as opposed to conventional optics, is based on fine structures causing refraction and/or diffraction, the structures having characteristic depths/heights and often also widths of typically a few micrometers (μm), for example of 0.5 μm-200 μm, preferably of between 0.5 μm and about 50 μm or between 0.5 μm and about 30 μm. In other words, the characteristic profile depths and the profile widths are of the order of a few wavelengths up to a few tens of wavelengths for refractive optics and of about one wavelength up to a few wavelengths for diffractive optics. As a rule of thumb, micro-optical elements have structures such that the phase relation of radiation present at different neighboring places on the structure is well-defined. This is opposed to classical, purely refractive optical elements, where the behavior of the radiation at different elements of the structure can be described in a geometrical optics picture. Micro-optical elements, thus, as opposed to classical optical elements (such as classical lenses, mirror elements etc.) can be regarded as having structures which are such that the wave nature of the light has to be taken into account and participates in the effect the micro-optical element has upon radiation.

Due to this principle, the light emitting device—apart from being easy to manufacture and thinner than comparable prior art light sources—may shape the initially emitted light in almost any manner, instead of only having the potential of partially and/or weakly collimating it. For example, apart from collimating or focussing the beam, it may also be shaped to provide any desired pattern—for example a logo of a company or a component of a figurative element etc. The light emitting device further may combine collimating or other shaping functionality for a range of wavelengths. This is useful for the case where the light emitting device comprises a plurality of electroluminescent elements emitting at different wavelengths. It may also be adapted to the situation where different light proportions originate from different locations within the light emitting device.

Even when just collimating the light emitted by an LED, the micro-optical element, when configured according to the shape and emission characteristics of the LED, offers a higher efficiency than a micro-optical element that is configured to replace a refractive collimating lens. Such a replacement is e.g. done in order to conserve space. However, simply replacing a refractive lens with a diffractive type micro-optical element that is also designed for a point source usually lowers the efficiency of the arrangement, i.e. the intensity of light emitted in the desired fashion. The light emitting device according to this invention takes into account the shape of the electroluminescent area and its emission characteristics and shapes it according to the application needs. In this way, the efficiency and the system performance can be improved significantly, when compared to classical and Fresnel lens solutions. Since the optical microstructures described in this invention can be placed very close to the emitting area or volume, the complete systems can be extremely compact.

A second principle of the invention is to couple the optical element, namely the micro-optical element, directly with an element comprising (or accommodating, or carrying) the micro-optical element, such as the housing of an LED source or the substrate in the case of an OLED. The micro-optical element may even be such that a micro-optical structure is directly imprinted on an at least partially transparent layer being directly attached to transparent material surrounding one or several electroluminescent elements, the transparent material for example being of the kind usually being present in a conventional LED. As an alternative, the micro-optical element may be such that a micro-optical structure is directly imprinted on said transparent material surrounding the LED chip. In any case, the optic used to collimate and/or shape the LED output is a diffractive/refractive micro-optical element placed directly in contact with the housing or substrate and with an optical function.

The at least partially transparent layer as well as the at least partially transparent material surrounding the electroluminescent element both do not have to be entirely transparent. Instead, at least one of them may for example comprise light influencing additives such as dyes, fluorescent materials, etc. If, as an example, a fluorescent dye is chosen, the material or the layer may even integrate further functionality, namely, it may also serve for the purpose of transforming primary light emitted by electroluminescent element into a particular, desired light wavelength or wavelength distribution.

Light emitting devices according to the invention feature the advantage that they, although they have a shaping optics, may have a flat surface and may be comparatively thin and essentially flat. They are therefore, compared to the state of the art LEDs much easier to handle and much easier to integrate into LED panels or devices having an LED light source etc. They thus can be readily mounted to almost any kind of device without causing special conditions to be fulfilled, for example conditions for the device's geometry. Especially, they can be used for very thin devices comprising an LED. If appropriate diode chips—such as OLED elements—are used, the whole package can possibly be as thin as little more than 100 μm—sheet-thin!

An alternative to this second principle of the invention is to provide the micro-optical element directly in a basis layer of an LED panel in a manner that LED sources without any shaping optics may easily be placed adjacent to this layer, this embodiment thus enabling an easy mounting of an LED panel and at the same time making collimation or other shaping of light emitted from an LED panel possible. This makes tailoring of LED panel functionality without any particular constraints possible. For example, the LED panel layer may comprise a regular array of predetermined spots for placing an LED, 'LED docks', each LED dock comprising a collimating optics placed on the panel layer in advance. Then, one may just place a desired pattern of LEDs on the panel layer, for example using an appropriate adhesive.

A further principle of the invention is that the micro-optical element's features are usually present in some plastic (polymer, or other formable material such as SolGel material). This is opposed to the state of the art, where optics elements either are a rather simple plastics dome lens of the kind already mentioned or—if they are of a higher quality—are usually made of glass. The plastic material contributes to the fact that the light source and the LED panel according to the invention are easy to manufacture. Further advantages of this include a larger variety of choosable optical properties (such as index of refraction, transmission characteristics etc.), lower cost and a lighter weight.

The shape of the micro-optical element may be obtained in a composing process by balancing and combining different optical functions and considering the extended nature of the electroluminescent element(s) as well as its surroundings (i.e. housing or substrate). The micro-optical element may be assumed to comprise one or more integrated optical functions designed by considering the position, size and shape of one or more electroluminescent elements, their output light distribution and the shape of the underlying housing/reflector.

This typically results in the fact that symmetry characteristics of the micro-optical element correspond to symmetry characteristics of the electroluminescent element. For example, an LED chip acting as the electroluminescent element usually is square shaped, it has a rotational symmetry of order four. If the LED is rectangular, it has a rotational symmetry of order two. In both cases, the LED also has line symmetry along two perpendicular lines. Geometric features of the micro-optical element, as projected onto the plane the of the micro-optical element, exhibit corresponding symmetries. When collimating a light beam, the corresponding symmetries clearly dominate the features of the micro-optical element. When arbitrary beam shaping is performed, the corresponding symmetric features may be superimposed with other geometric features related to the resulting output beam shape. The micro-optical pattern will show a two-fold symmetry for the case where 2 separate LED chips or complete devices are combined to a single output beam.

The invention, in addition to the above described benefits, features several advantages. One advantage is that light emitting devices and LED panels according to the invention can be manufactured at low cost using a high throughput embossing or casting process. Especially, the micro-optical structure can be added to the housing during production of the light emitting device.

A further advantage is that the light emitting devices and LED panels can combine different functionalities without there being a need to have more elements. For example, one single LED collimating optics can be such that non-coherent light of different wavelengths originating from different electroluminescent elements is collimated without there being a need for a plurality of optical elements, i.e. the optical microstructure can be designed for extended sources that can be polychromatic. This is in contrast to the state of the art, where a dome lens is designed for essentially only collimating light of from one LED chip, typically assumed to be a point source having one wavelength, and thus is not useful for situation where a plurality of electroluminescent elements is present or where around the LED chip (or other electroluminescent element) fluorescent material is arranged.

According to a special embodiment of the invention, the micro-optical element comprises a plurality of independent sections, each having an individual optical function.

The method of fabricating a light emitting device comprises the steps of providing at least one electroluminescent element being at least partially embedded in at least partially transparent material and of adding to an outermost surface of said at least partially transparent material, a structure serving as micro-optical element. This may be done by adding an at least partially transparent layer to said surface and embossing a micro-optical structure in it. As an alternative, an at least partially transparent layer may be cast on the surface in a manner that it is provided with micro-optical structures. In any case, there is a large potential to apply new and efficient manufacturing techniques to fabricate the light emitting device or an LED panel, and to vary such techniques to provide optimized results.

BRIEF DESCRIPTION OF THE DRAWINGS

In the following, preferred embodiments of the invention are described with reference to schematical drawings.

DETAILED DESCRIPTION OF THE INVENTION

The light emitting device shown in FIG. 2 comprises an LED body made up of an LED chip 1, a housing 2 and epoxy 3 (or other at least partially transparent material) surrounding the LED chip 1, all for example, but not necessarily, in the manner of conventional LEDs described with reference to FIG. 1. The light emitting device further comprises an at least partially transparent layer 11, which is for example laminated or cast onto the housing 2 with the epoxy 3 and which may also be of an epoxy resin or alternatively may be of an other thermoplastic or duroplastic material. It may, for example, be of a UV-curing or thermo-curing material. Although according to the most preferred embodiments this at least partially transparent layer is made of a polymer material, it may also be made of glass. The thickness of this additional layer may for example vary between 5 µm about 1 mm, preferably less than 150 µm, depending on the particular use. The at least partially transparent layer 11 comprises a micro-optical element 12 in the form of a micro-optical structure on a surface—the surface, in the drawing, being an outermost surface of the layer 11 and of the entire light source.

In other words, the electroluminescent element 1 comprises a light emitting surface and a base opposed to said light emitting surface, wherein said base is attached to an inner surface of the housing and/or substrate and wherein the light emitting surface is covered by at least partially transparent material 3 at least partially filling the housing 2 or covering the substrate. The at least partially transparent material 3 defines a first surface, wherein an at least partially transparent layer sticks to said first surface and defines a second surface essentially parallel to said first surface. The micro-optical element 12 is made up of micro-optical structures present in said second surface.

The micro-optical structure is designed in a manner that light emitted by the LED chip 1 or diffusely reflected by the housing 2 is collimated and/or otherwise shaped by diffraction and/or refraction after traversing the mentioned surface.

As an alternative to an LED chip, an other electroluminescent element (not shown in the Figures) may be used. Such an other electroluminescent element—for example an OLED—may for example be arranged in a similar set-up as shown in FIG. 2, a main difference between a conventional LED chip and an OLED being that the latter is thinner.

As yet another alternative, a plurality of electroluminescent elements may be present.

Instead of being a self-sticking layer, the essentially transparent layer 11 may be glued to the LED body, by an at least partially transparent adhesive. In such a case, the microstructure itself may be made of any material, according to a special embodiment, it may even comprise a carrier made of glass.

Now referring to the design process, as an example, a collimation/shaping optics may be designed using the following process steps:

Step 1: The chip is modeled as an array of ideal point sources. The distribution of each virtual source is assumed to match the distribution of the LED chip, i.e. for a Lambertian chip distribution each point source is also assumed to be Lambertian.

Step 2: The housing is modeled as a weighted, non-evenly spaced array of secondary point sources. The distribution of each source is assumed to match the reflection characteristics of the housing material, e.g. as Lambertian, while relative weights of individual sources in the array are calculated by considering how much energy (and in which angle) hits the corresponding point on the housing, i.e. how much energy there is to reflect and to which direction in the first place. The housing is typically assumed to be an ideal Lambertian reflector, i.e. the reflected light is assumed to have a Lambertian distribution. To this end, all points of the housing receiving light from the source are assumed to act as secondary Lambertian point sources. In addition, the total intensity emitted by each of these secondary sources must be identical to the energy the each modelled point is receiving from the chip, i.e. from the primary virtual sources. This is achieved by scaling each secondary source with appropriate weight function calculated from the received energy. Finally, the primary direction of each secondary source, i.e. the direction of maximum intensity, is calculated based on a weighted average over incidence angles of the rays hitting the point in question. Or to put it in another way, each secondary source is to have total energy and primary direction matching a weighted average of the incident light to a point on the housing corresponding with the source.

Step 3: An ideal collimation/shaping optic is designed for each virtual point source individually. The obtained optical functions are then combined on the exit surface of the LED unit (i.e. on top of the epoxy layer) by weighted summation. The weights for the summation are calculated by considering how much energy each virtual source contributes to each spot on the exit surface, i.e. weights correspond to relative intensities of each source at each point.

Step 4: Conversion of the total optical function into a surface profile can be done e.g. via the principle of transmission function. Then it is first assumed that the optical component connects the input field (i.e. field at the exit surface coming from the point sources) and the output field (i.e. a field distribution after the element, in this case a collimated field) in a point-wise manner and that the connection can be presented as a transmission function. With these assumptions the transmission function is then simply the difference of the two fields, i.e. output field minus input field. Finally, the physical description of the element can be calculated from the transmission function by solving what physical profile corresponds to a given transmission function value. In a simplest possible case this is reduced to calculating how much material is needed to introduce a amplitude/phase change matching the transmission function, i.e. how deep the profile must be. In more complicated cases e.g. the local shape of the profile, refractive index distribution etc. may also be considered. In fully rigorous case the concept of transmission function is not valid, and the input and output field are connected via Maxwell's equations and the electromagnetic boundary conditions at the interface, and the physical dimension of the required element must be obtained by solving for a surface that satisfies the equations and the boundary conditions at all points of the considered space simultaneously.

Although the invention is not restricted to diffraction but includes refraction, the micro-optical structure may be such that the optic is comparable to a diffractive optical element (DOE) having several integrated optical functions.

Figure 2:
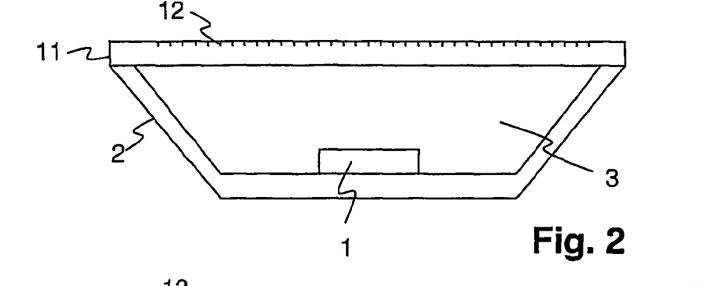
FIGS. 2, 3 and 4 show light sources according to the invention.
Figure 3:
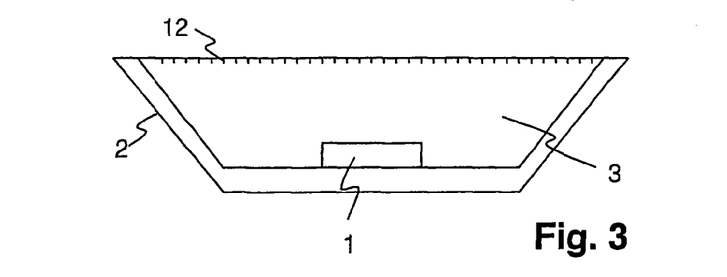

The light source of FIG. 3 differs from the light source of FIG. 2 in that it does not necessarily comprise an at least partially transparent layer atop the epoxy material. Instead, the micro-optical element 12 is made up of micro-optical structures directly on the epoxy (or other at least partially transparent) material 3.

Figure 4:
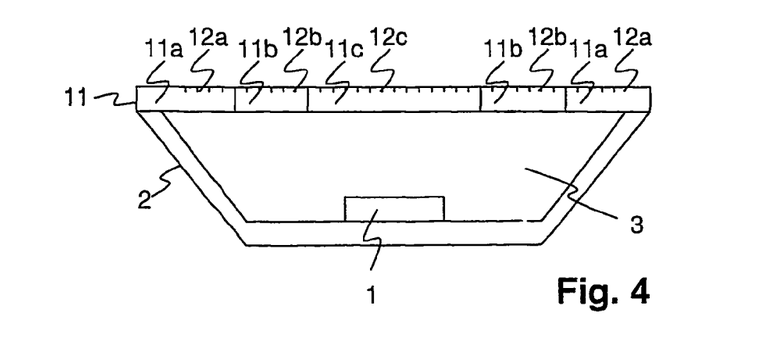

Now turning to FIG. 4, the light source depicted therein has an at least partially transparent layer which is divided into sections 11a, 11b, 11c, each adding a different functionality. This embodiment is useful for the cases where the above mentioned resulting optical function exceeds the current state of art in available fabrication techniques. In such case the function can be approximated by breaking it into several parts, and by realizing each part as an independent section of the element.

Although in FIG. 4 the different sections are shown as individual layer bodies, this need not be the case. On the contrary, usually, the different sections will be differing micro-optical structures 12a, 12b, 12c present in a single at least partially transparent layer.

Further, it is also possible to have a structure for having different functionalities without having different sections (in a macroscopic sense). One merely has to combine structure features having the different functions, for example, protrusions having two end faces, one for collimating, by diffraction and/or refraction, light from a first LED chip and another one for collimating light from a second LED chip, etc.

Figure 5:
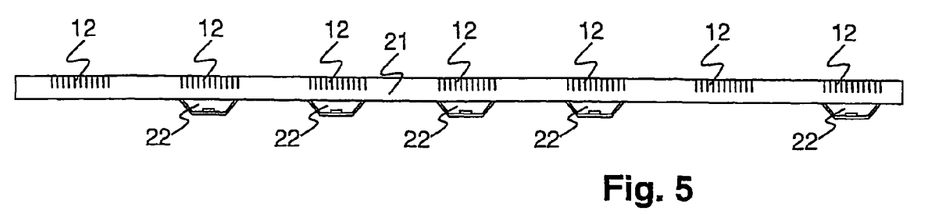
FIG. 5 depicts an LED panel according to the invention.

FIG. 5 represents an LED panel basis layer 21 with a regular pattern of micro-optical structures 12 of the kind described above. The micro-optical structures are for example all designed for collimating light of a particular wavelength range, the wavelength range including a wavelength of light emitted by an LED to be attached to the panel basis layer. The LED panel further comprises several LED bodies 22, each having an LED chip and a housing, and also comprising an epoxy (or other at least partially transparent material) surrounding the LED chip. The LED bodies 22 are attached to one side of the basis layer 21, for example by means of the sticking property of the epoxy (or other at least partially transparent material), by a sticking property of the basis layer, or by means of an intermediate adhesive layer (not shown), the optical properties of which were taken into account for designing the micro-optical structures 12. The LED bodies are attached at places of the micro-optical structures, however, not all micro-optical structures have to have a corresponding LED body.

An LED panel basis layer, together with appropriate current supply means for LEDs mounted on it, may serve as a universal panel. The panel basis layer may be injection molded or imprinted in one single manufacturing step.

The panel basis layer may, as an example, be made of the materials described above for the at least partially transparent layer of the LED. As an alternative, the panel basis layer may also be made of a glass material.

It can be seen that the manufacturing of LED panels, compared to existing LED panels, is considerably more straight forward, since one merely has to add standard, off-the-shelf LEDs to a standardized basis layer by standard means.

Figure 6A:
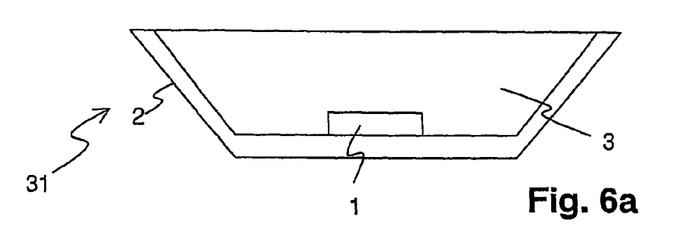
FIGS. 6a through 6c show a manufacturing process of a light source according to the invention.
Figure 6B:
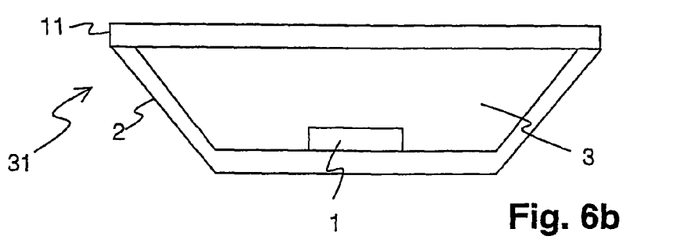
Figure 6C:
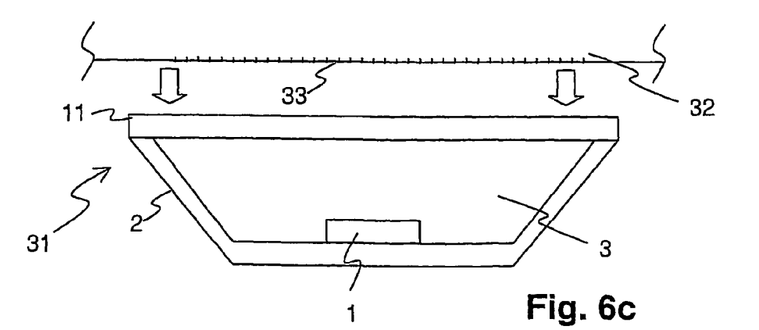

FIGS. 6a through 6c show a manufacturing method of a light source according to the invention. The method includes the steps of taking an LED 31 comprising an electroluminescent element 1—here being and LED chip—, a housing 2, and epoxy (or other at least partially transparent material) (FIG. 6a), adding, for example by lamination, an at least partially transparent layer 11 of a thermoplastic material (FIG. 6b) and—at an elevated temperature—imprinting (or embossing), by means of a re-usable imprinting tool 32 having protrusions 33 corresponding to indentations of the micro-optical structure to be made, a micro-optical structure on a surface of the at least partially transparent layer 11. As an alternative to this step-by-step process, the imprinting and lamination step may be combined in that the lamination press comprises an imprinting tool for directly imprinting the structures on the layer.

In an alternative embodiment, the at least partially transparent layer 11, initially being in a viscous state may be cast (or injection molded) in a gap between the epoxy (or other at least partially transparent material) and the embossing tool 32, and may then be cured, for example UV-cured. The embossing tool preferably is removed only when the at least partially transparent layer 11 material has at least partially been cured. Of course, in this embodiment, the viscous material may be placed on top of the epoxy (or other at least partially transparent material) to form a layer before the embossing tool is put in place.

More generally, the method for producing the micro-optical structure may include any form of embossing or casting UV- and/or chemical- and/or thermosetting material using a structured tool. Additional layers may be present between the LED body and the layer comprising the micro-optical structure. As an alternative, a carrier being a layer and already comprising the microstructure (in it or attached to it) may be glued or laminated or otherwise fixed to an LED body. As yet another alternative, a part of the LED body (including the at least partially transparent material surrounding the electroluminescent element) may be structured directly—by embossing or casting (or injection molding).

Figure 7:
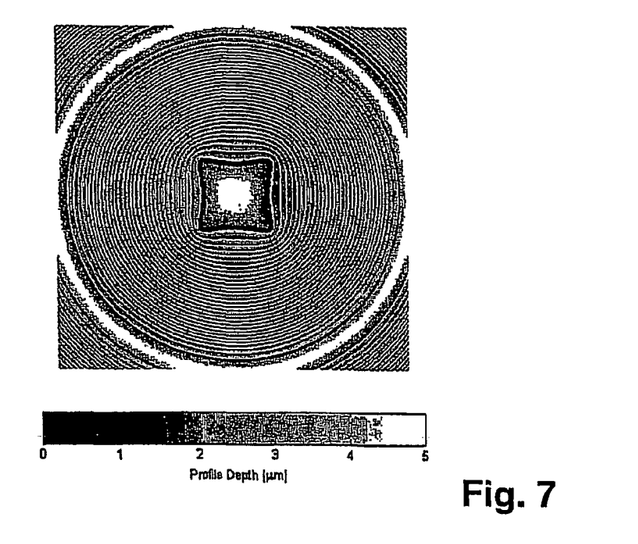
FIG. 7 represents a micro-optical structure.
Figure 8:
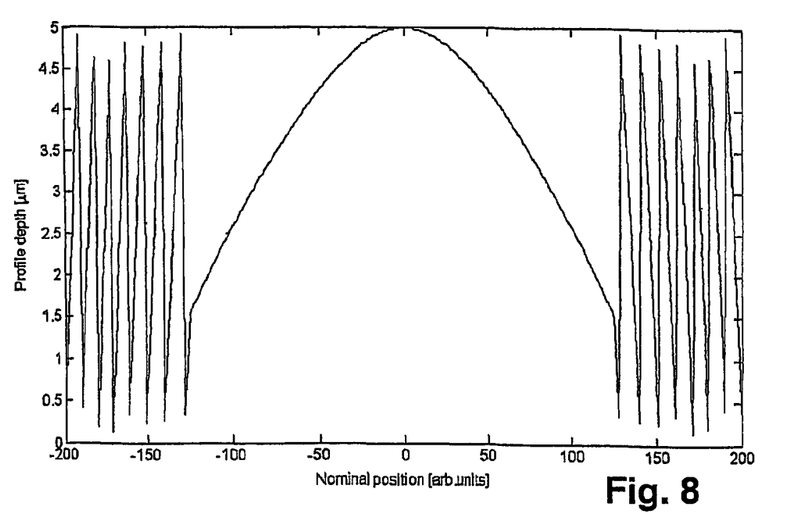
FIGS. 8 and 9 show cross sections of micro-optical structures as depicted in FIG. 7.
Figure 9:
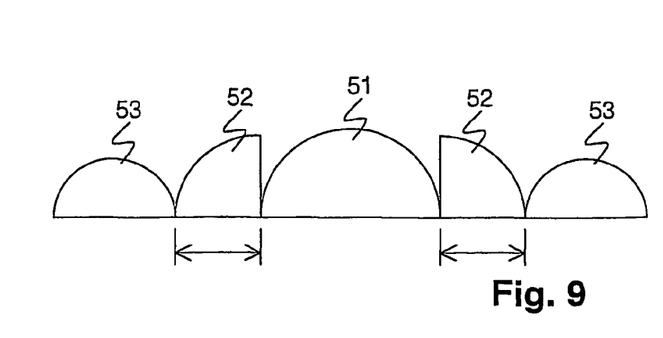

The micro-optical structure 41 shown in FIG. 7 collimates the light emitted by an LED source. It is an example of a micro-optical structure that may be present in a light source as shown in any one of FIGS. 2-5. The shading is a measure of the profile depth: the darker the shading, the deeper the feature. In the figure, a central, continuous portion reflecting the dimensions of the electroluminescent element becomes visible. If the electroluminescent element is replaced by a plurality of electroluminescent elements, a corresponding plurality of continuous portions is present. FIG. 8 represents a cross section through a central part of the structure shown in FIG. 7. It shows the profile height (in µm) as a function of the position (in arbitrary units). The structures may be scaled. Their dimensions depend on the wavelength. If the wavelength is varied and the structure dimensions are scaled proportionally to the wavelength, the functionality remains unchanged. Further, the structure heights (or depths) may be altered by adding or subtracting heights such that the phase of the radiation is altered by an integer number times $2\pi$, i.e., the structure heights are varied by an integer number times the wavelength of the light in the structure material. Of course, in this case also the structure widths have to be adapted, the smaller the structure heights, the finer the structure widths. Finally, FIG. 9 schematically depicts the essential proportions of the profile shown in FIG. 7. The proportions are: a central lens 51 (which also becomes visible in FIGS. 7 and 8), an intermediate proportion 52, in practice corresponding to a plurality of Fresnel-lens-like half-bridge shaped protrusions (and symbolized in FIG. 9 by a single such protrusion), and a border lens 53. The central 51 lens will act as a collimation lens for the extended electroluminescent element. The lens is essentially a weighted average of several off-axis lenses. The intermediate proportion 52 acts as a further collimator and turns light hitting it towards the axis. The border lens proportion 53 is designed to especially collimate light reflected from the edges of the housing of the chip. The lenses are designed by considering the housing as a secondary extended source which additionally has varying distance to the lens.

Figure 10:
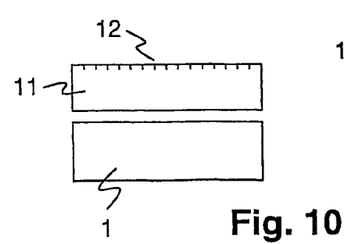
FIGS. 10 and 11 show relative arrangements and sizes of a LED chip and a micro-optical structure according to the invention.
Figure 11:
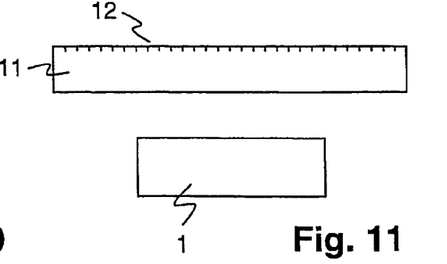

FIGS. 10 and 11 show relative arrangements and sizes of a LED chip 1 and a micro-optical structure 12 shaped in the at least partially transparent layer 11. Not shown are a housing and/or a transparent layer mechanically connecting the layer 11 and the LED chip 1. Here, as in the embodiments according to FIGS. 12 and 13, the horizontal extension of the LED chip 1 may be in the range of e.g. 0.5 to 2 millimeters. The maximum thickness of the micro-optical structure 12 which corresponds to the minimum thickness of the layer 11 ranges from ca. 1 micrometer for monochromatic light, to ca. 20 micrometers for light of different wavelengths.

In the arrangement according to FIG. 10, the shape and extension of the layer 11 approximately matches that of the LED chip 1, and the layer 11 is mounted in close proximity to the LED chip 1, e.g. with an air gap or distance of several micrometers to 20 micrometers to one millimeter.

As a variation to FIG. 11, the micro-optical structure can be placed on the side facing the LED chip, or micro-optical structures may be provided on both sides of the layer 11. The layer 11 may also comprise a second micro-optical structure on the face that is oriented towards the LED chip 1. This allows to reduce the air gap and to increase the functionality of the beam shaping. In such cases, where the micro-optical element is located at a distance well below 50-100 micrometers, the local emission variations of the LED chip can also be taken into account with very high accuracy and incorporated into the design of the micro-optical structure.

As a further generalization of FIG. 11, the layer 11 containing the micro-optical structure 12 is not limited to planar or flat shapes. The micro-optical structure can also be designed for and fabricated on differently shaped surfaces, taking into account and using their optical function. For example, such surfaces may comprise a spherical or trapezoidal cross section.

In the arrangement according to FIG. 11, the extension of the layer 11 is e.g. twice or more than that of the LED chip 1. Accordingly, the distance to the layer 11 is larger, e.g. up to 0.5 millimeters. This arrangement is more suited to LEDs with a lambertian output characteristic. The more directed an LED's output is, the smaller the micro-optical structure 12 may be and the closer to the LED chip 1 it may be arranged.

Figure 12:
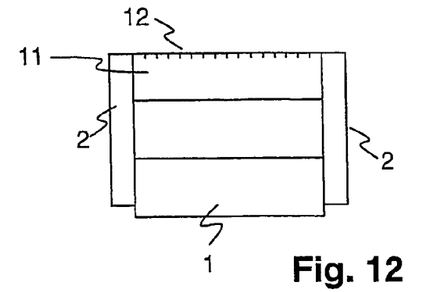
FIGS. 12 and 13 show further preferred embodiments of the invention.

FIG. 12 shows a light emitting device where the layer 11 is connected to the LED chip 1 by means of a housing 2. The larger the distance, the more it is appropriate to incorporate the secondary emissions at the inner surface of the housing 2 in the design of the micro-optical structure 12, as described above.

Figure 13:
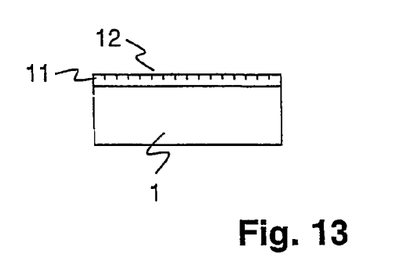

FIG. 13 shows a light emitting device where the layer 11 is laminated or cast on the LED chip 1 and the micro-optical structure 12 is shaped, that is, embossed or molded into the layer 11. The thickness of the layer is e.g. in the range of 20 micrometers or more. The layer 11 substantially covers a light emitting surface of the LED chip 1. It preferably does not substantially extend over the light emitting surface of the LED chip 1.

Figure 14:
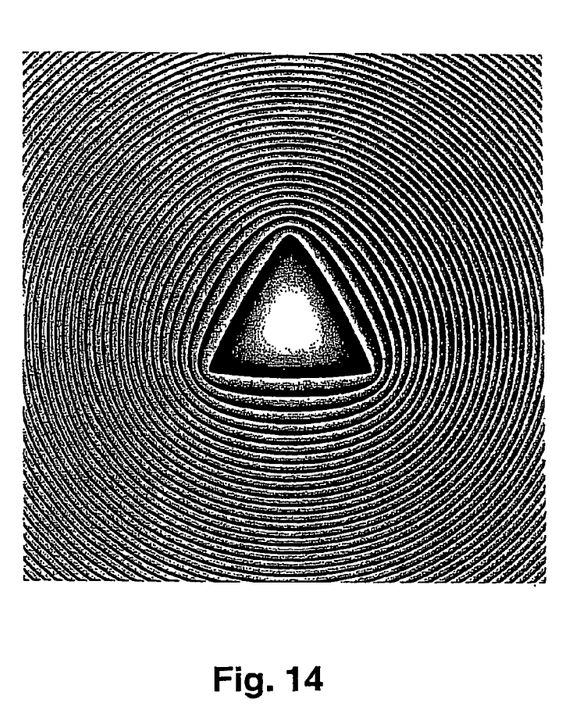
FIGS. 14 to 16 represent further micro-optical structures.
Figure 15:
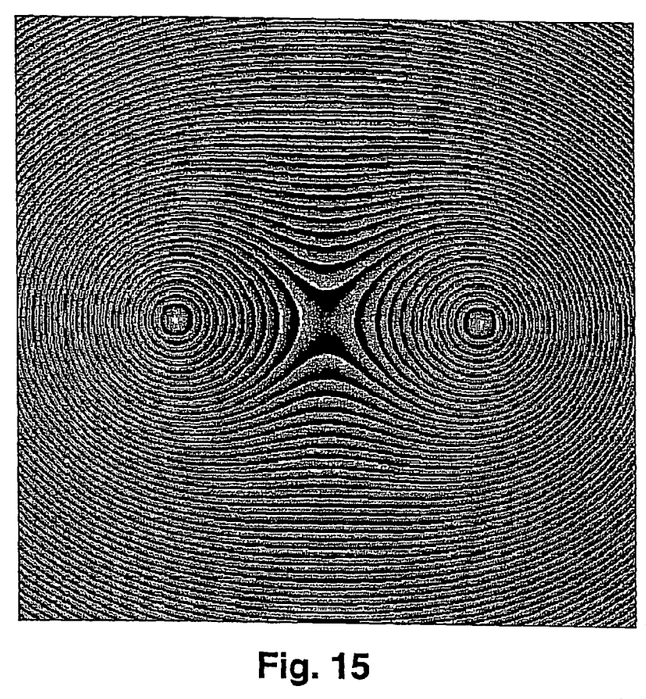
Figure 16:
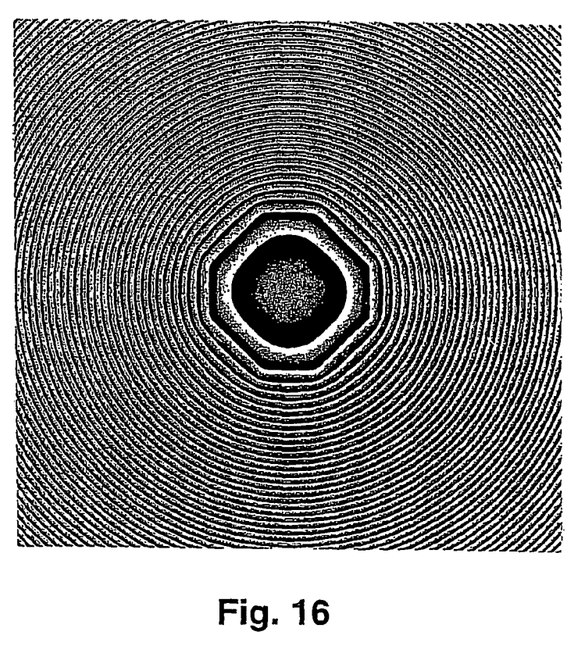

FIGS. 14 to 16 show representations of further micro-optical structures, analogous to FIG. 7, for converting the output of a specific light source shape and/or light source arrangement into a circular beam. FIG. 14 is a representation of a structure for converting the output of a triangular light source or LED, having a rotational symmetry of order three. FIG. 15 is a representation of a structure for converting the output of two separate, relatively small light sources, having a rotational symmetry of order two. FIG. 16 is a representation of a structure for converting the output of an octagonal light source. Corresponding to the exact shape of the light source, it has a rotational symmetry of order four (for an octagon with two alternating lengths of sides) or eight (for a regular octagon).

Various other embodiments may be envisaged. For example, the housing of the LED does not have to be shaped in the manner shown in the drawings but may have any shape and consist of any material combination. The electroluminescent element does not have to be a conventional LED chip, instead any device that emits light upon injection of a current may be used. Further, the micro-optical structures do not have to be present in an outermost surface of the light source but may be present in any suitable surface.

What is claimed is:
1. An optical element comprising:
   at least one at least partially transparent layer;
   a plurality of micro-optical structures arranged in said layer;
   wherein the micro-optical structures are at least one of diffractive type micro-optical structures or refractive type micro-optical structures and have characteristic profile dimensions of between 0.5 and 200 micrometers;
   wherein the micro-optical structures are arranged in at least two sections of said layer, each section comprising a pattern of micro-optical structures defining an optical function;

wherein the patterns of micro-optical structures at least in adjacent sections are different from one another;

wherein the at least two sections of the micro-optical structures are configured to collimate light; and wherein the optical element consists of a single structure having a rotational symmetry.

2. An optical element according to claim 1, wherein the micro-optical structures of the micro-optical element are designed according to the position, size and shape of the one or more electroluminescent elements, and output light distribution of the one or more electroluminescent elements to be used in conjunction with the optical element.

3. An optical element according to claim 1, wherein the different sections comprise different micro-optical structures present in a single at least partially transparent layer.

4. An optical element according to claim 1, wherein the independent sections each have an individual optical function.

5. A method for manufacturing an optical element comprising the steps of:

providing an at least one at least partially transparent layer;

arranging micro-optical structures in said layer, wherein the micro-optical structures are at least one of diffractive type micro-optical structures or refractive type micro-optical structures and have characteristic profile dimensions of between 0.5 and 200 micrometers;

arranging the micro-optical structures in at least two sections of said layer, wherein each section comprises a pattern of micro-optical structures defining an optical function, wherein the patterns of micro-optical structures at least in adjacent sections are different from one another, wherein the at least two sections of the micro-optical structures are configured to collimate light, and wherein the optical element consists of a single structure having a rotational symmetry.

6. A method as claimed in claim 5, wherein the step of arranging the micro-optical structures in the at least one layer comprises embossing said micro-optical structures in each section of said layer.

7. A method as claimed in claim 5, further comprising manufacturing the different sections by manufacturing different micro-optical structures in a single at least partially transparent layer.

8. An optical element according to claim 1, further comprising a light emitting element arranged such, with respect to the at least one at least partially transparent layer, that light emitted by the light emitting element is incident on at least two sections comprising micro-optical structures that are different from another.

9. An optical element according to claim 1, wherein the micro-optical structures form a pattern that, as projected onto a plane of the micro-optical element, has line symmetry along two perpendicular lines.

10. The optical element according to claim 1, wherein the optical element is designed to be coupled to a housing with one electroluminescent element, and wherein the diffractive optical features of the micro-optical element are designed according to the position, size and shape of the one electroluminescent element, and the design of the diffractive optical features of the micro-optical element also incorporates the shape and reflection characteristics of the housing.

11. The optical element according to claim 1, wherein the single structure of the optical element has a rotational symmetry of order two.

12. The optical element according to claim 1, comprising an intermediate portion having a plurality of Fresnel-lens-like shaped protrusions.

13. The optical element according to claim 12, wherein the intermediate portion surrounds a central lens portion of the optical element.

14. The optical element according to claim 12, further comprising a border lens portion outside of the intermediate portion, the border lens portion being designed to collimate light reflected from edges of a housing on which the optical element is designed to be placed.

15. The optical element according to claim 1, wherein the optical element is designed to collimate light emitted by an electroluminescent element that has a rectangular shape.

16. The optical element according to claim 12, wherein the optical element is designed to collimate light emitted by an electroluminescent element that has a rectangular shape.

17. The optical element according to claim 1, wherein the optical element is designed to collimate light emitted by a single light emitting diode that has a rectangular shape.

18. The optical element according to claim 12, wherein the optical element is designed to collimate light emitted by a single light emitting diode that has a rectangular shape.

19. In a light emitting device comprising a housing with one electroluminescent element, an optical element comprising:

at least one at least partially transparent layer;

a plurality of micro-optical structures arranged in said layer;

wherein the micro-optical structures are at least one of diffractive type micro-optical structures or refractive type micro-optical structures and have characteristic profile dimensions of between 0.5 and 200 micrometers;

wherein the micro-optical structures are arranged in at least two sections of said layer, each section comprising a pattern of micro-optical structures defining an optical function;

wherein the patterns of micro-optical structures at least in adjacent sections are different from one another; and wherein the at least two sections of the micro-optical structures are configured to collimate light; and wherein the optical element consists of a single structure having a rotational symmetry wherein the optical element is designed to be coupled to the housing with one electroluminescent element, and wherein the diffractive optical features of the micro-optical element are designed according to the position, size and shape of the one electroluminescent element, and the design of the diffractive optical features of the micro-optical element also incorporates the shape and reflection characteristics of the housing.

* * * * *